(12) United States Patent
Chau et al.

(10) Patent No.: US 12,512,450 B2
(45) Date of Patent: Dec. 30, 2025

(54) SEMICONDUCTOR DEVICE AND A METHOD OF MANUFACTURING A SEMICONDUCTOR DEVICE

(71) Applicant: NEXPERIA B.V., Nijmegen (NL)

(72) Inventors: On Lok Chau, Nijmegen (NL); Fei Wong, Nijmegen (NL); Martin Li, Nijmegen (NL); Hugo Wong, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 769 days.

(21) Appl. No.: 17/591,408

(22) Filed: Feb. 2, 2022

(65) Prior Publication Data

US 2022/0246595 A1 Aug. 4, 2022

(30) Foreign Application Priority Data

Feb. 3, 2021 (EP) .................... 21154945

(51) Int. Cl.
*H01L 23/14* (2006.01)
*H01L 21/56* (2006.01)
*H01L 23/00* (2006.01)
*H01L 23/31* (2006.01)
*H01L 25/00* (2006.01)
*H01L 25/07* (2006.01)
*H01L 25/18* (2023.01)

(52) U.S. Cl.
CPC ............ *H01L 25/18* (2013.01); *H01L 21/565* (2013.01); *H01L 23/3114* (2013.01); *H01L 24/19* (2013.01); *H01L 24/20* (2013.01); *H01L 25/074* (2013.01); *H01L 25/50* (2013.01); *H01L 2224/214* (2013.01); *H01L 2224/215* (2013.01); *H01L 2924/01029* (2013.01); *H01L 2924/1033* (2013.01); *H01L 2924/13064* (2013.01); *H01L 2924/13091* (2013.01)

(58) Field of Classification Search
CPC . H01L 23/3114; H01L 23/28; H01L 25/0657; H01L 25/074
See application file for complete search history.

(56) References Cited

U.S. PATENT DOCUMENTS

| | | | |
|---|---|---|---|
| 9,721,944 B2 | 8/2017 | Fursin et al. | |
| 10,410,952 B2 * | 9/2019 | Bayerer | H01L 21/76838 |
| 2012/0187565 A1 | 7/2012 | Ewe et al. | |
| 2012/0211892 A1 | 8/2012 | Kim et al. | |

(Continued)

OTHER PUBLICATIONS

Extended European Search Report and Written Opinion for corresponding European application EP 21154945.6, 10 pages dated Jul. 7, 2021.

*Primary Examiner* — Trang Q Tran
(74) *Attorney, Agent, or Firm* — Ruggiero McAllister & McMahon LLC

(57) ABSTRACT

A semiconductor device is provided, including a first die, such as a GaN HEMT die, and a second die, such as a MOSFET die, with the second die positioned on the top of the first die. The second die is attached using a die attach adhesive. The semiconductor device further includes an encapsulant deposited on the top of the semiconductor device. The encapsulant is covering the first die and the second die. Metalized vias are created within the encapsulant, and the metalized vias are arranged to distribute terminals of the first die and the terminals of the second die to the top side of the semiconductor device.

5 Claims, 6 Drawing Sheets

(56) References Cited

U.S. PATENT DOCUMENTS

2013/0283260 A1* 10/2013 Chen ................. H04M 1/72406
717/174
2015/0303128 A1* 10/2015 Otremba ................. H01L 24/20
257/676
2020/0020638 A1   1/2020 Heo et al.

* cited by examiner

SEMICONDUCTOR DEVICE AND A METHOD OF MANUFACTURING A SEMICONDUCTOR DEVICE

CROSS REFERENCE TO RELATED APPLICATION

This application claims the benefit under 35 U.S.C. § 119(a) of European Application No. 21154945.6 filed Feb. 3, 2021, the contents of which are incorporated by reference herein in their entirety.

BACKGROUND OF THE DISCLOSURE

1. Field of the Disclosure

The present disclosure relates to a semiconductor device comprising two dies positioned in a cascode configuration. The disclosure also relates to a method of manufacturing a semiconductor device.

2. Description of the Related Art

WBG (Wide Band Gap) devices, that are known in the art, are normally-on, e.g. a silicon carbide (SiC) junction gate field-effect transistor (JFET), a depletion-mode gallium nitride (GaN) high-electron-mobility transistor (HEMT), etc. To ensure safe operation, a silicon metal-oxide-semiconductor field-effect transistor (MOSFET) device is usually connected to a WBG device in a cascode way, so to make a normally-off operation mode for the WBG device. Said cascode can be constructed in a side-by-side configuration or a stack-die configuration.

In general, as known in the art, the stack-die configuration offers certain advantages, e.g.:
- a simplified die attach interconnect scheme,
- a better drain-source on resistance (Rdson) due to a direct connection of devices,
- direct bonded copper (DBC) substrate is not required, and more space available for accommodating a larger power die.

Known examples of a side-by-side configuration and a stack-die configuration are shown in FIG. 1a and FIG. 1b, respectively.

There are known GaN HEMT devices that are cascoded into various package types.

It is also known in the art that for typical power module constructions, instead of discrete packages, multiple bare die are generally used so to achieve more flexible and more effective layout within a limited area on a module substrate. To further enhance the performance and size reduction, a stack-die is the development trend. However, supply of stack-die directly will pose many technical challenges including the known good die (KGD) issue.

A known semiconductor device is described in U.S. Pat. No. 9,721,944B2 patent. In this patent a die pad structure for external interconnect is disclosed.

As shown in FIG. 2, a hybrid semiconductor bipolar switch is implemented by die-mounting a high-voltage normally-on bipolar switch chip and a low-voltage normally-off FET chip side-by-side on a metallized ceramic substrate board. Connections between the chips and to the substrate are made by a wire-bonding. The ceramic material may be, for example, aluminum nitride, aluminum oxide, silicon nitride, or a similar material. The metallization on the ceramic board may be, for example, direct-bonded copper (DBC), actively-brazed copper (ABC), a molybdenum-based alloy, etc., any of which may be combined with titanium, tungsten, nickel, platinum, and/or gold coatings to facilitate die-attach and/or prevent inter-diffusion and oxidation of various metallization layers. Similarly, various coatings may be overlayed on the semiconductor chips where they are to be attached and/or bonded.

A hybrid switch may also be implemented as a "stacked" device by directly mounting a low-voltage normally-off FET chip onto a bonding pad of a high-voltage normally-on bipolar switch chip. FIG. 2 is a cross-sectional view of an example of such a device. As depicted in FIG. 2, a normally-on bipolar switch chip 301 has a bonding pad 305 for a low voltage, high-current connection. The bonding pad 305 is connected to the emitter of an IGBT on chip 301. Chip 301 is attached to a metallic surface 310 using a die attach material 302, such as a solder or conductive adhesive. The metallic surface 310 is partly of an insulating ceramic board or a lead-frame. A low-voltage normally-off FET chip 306 is mounted with a die attach material 304 onto the bonding pad 305. A gate terminal 309 of FET chip 306 is used for gate control of stacked cascode 200. A source terminal 308 of FET chip 306 is connected to a gate terminal 303 of the normally-on bipolar switch chip 301 via an interconnect 307. In this configuration, parasitic series resistance and inductance of the high-current interconnect between normally-on bipolar switch 301 and low-voltage normally-off switch 306 will be minimized, thereby reducing undesirable voltage overshoots during switching under high di/dt and dv/dt conditions.

SUMMARY

Various example embodiments are directed to the disadvantage as described above and/or others which may become apparent from the following disclosure.

According to an embodiment of this disclosure a semiconductor device comprises a first die (e.g. a GaN HEMT die) and a second die (e.g. a MOSFET die) positioned on the top of the first die. The second die is attached using a die attach adhesive or solder. The semiconductor device further comprises an encapsulant deposited on the top of the semiconductor device, which encapsulant is covering the first die and the second die. Metalized vias are created within the encapsulant, wherein the metalized vias are arranged to distribute terminals of the first die and the terminals of the second die to the top side of the semiconductor device.

In an embodiment of the present disclosure a gate terminal of the MOSFET die, a source terminal of the MOSFET die, a gate terminal of the GaN HEMT die and a drain terminal of the GaN HEMT die are distributed via the metalized vias to the top side of the semiconductor device.

The semiconductor device can be a power semiconductor device. The disclosure also relates to a method of producing a semiconductor device. The method comprises the steps:
attach a first die (e.g. a GaN HEMT die) on a film carrier,
attach a second die (e.g. a MOSFET die) on the first die using a die attach adhesive or solder,
cure the die attach adhesive or solder,
encapsulate the first die and the second die with a mold compound or other encapsulant,
drill vias within the encapsulant with a laser to the first die and second die pads,
metallize the vias, so to make electrical contacts for the first die and for the second die, sinter a thick Cu film on the encapsulant, so to create terminals of the semiconductor device, alternative metal material can be used, such as sinter a thick Ag film on the encapsulant.

singulate the semiconductor device.

The method can further comprise a step of depositing an organic solderability preservative on the thick Cu film so to prevent Cu oxidation.

A novel package as described in the embodiment of the present disclosure has significant advantages:

a package outline is suitable for relatively easy manufacturing in both, an integrated device manufacturing (IDM) and a customer module assembly.

a foot print reduction is secured, e.g. from 12×12 (CCPAK) to 5×6 (near chip scale package)

a final test and burn-in for KGD is enabled semiconductor package terminals can be designed for an advanced assembly, such as a flip chip, a Cu wire bonding, etc.

The semiconductor package according to the embodiments of the present disclosure is suitable for use in a power module where a customer can connect multiple packages together for various specific power supply applications. Instead of a bare die, the package can support test and burn-in, and provide a KGD (known good die) solution to a customer. The near chip scale package also reduces foot print requirement within the limited space of a power module, with an improvement in electrical and thermal performance. The package terminals can work with different interconnect technologies in module assembly, and the terminal locations can be re-distributed for more flexible substrate layout.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

DETAILED DESCRIPTION

Figure 1A:
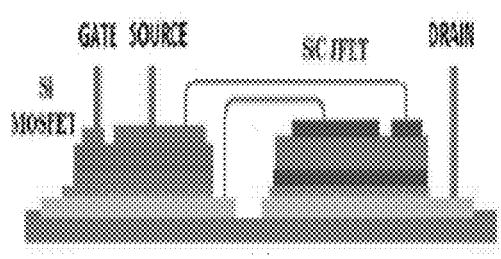
FIGS. 1a and 1b show known semiconductor devices.
Figure 1B:
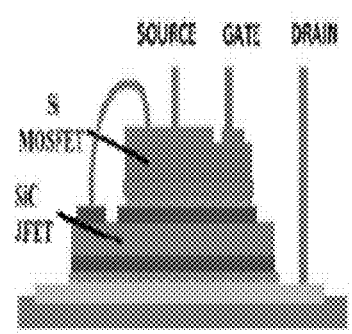
Figure 2:
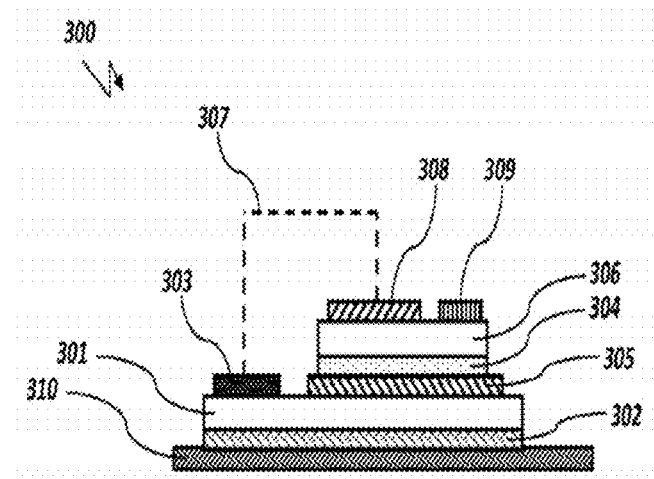
FIG. 2 shows a known semiconductor device.
Figure 3:
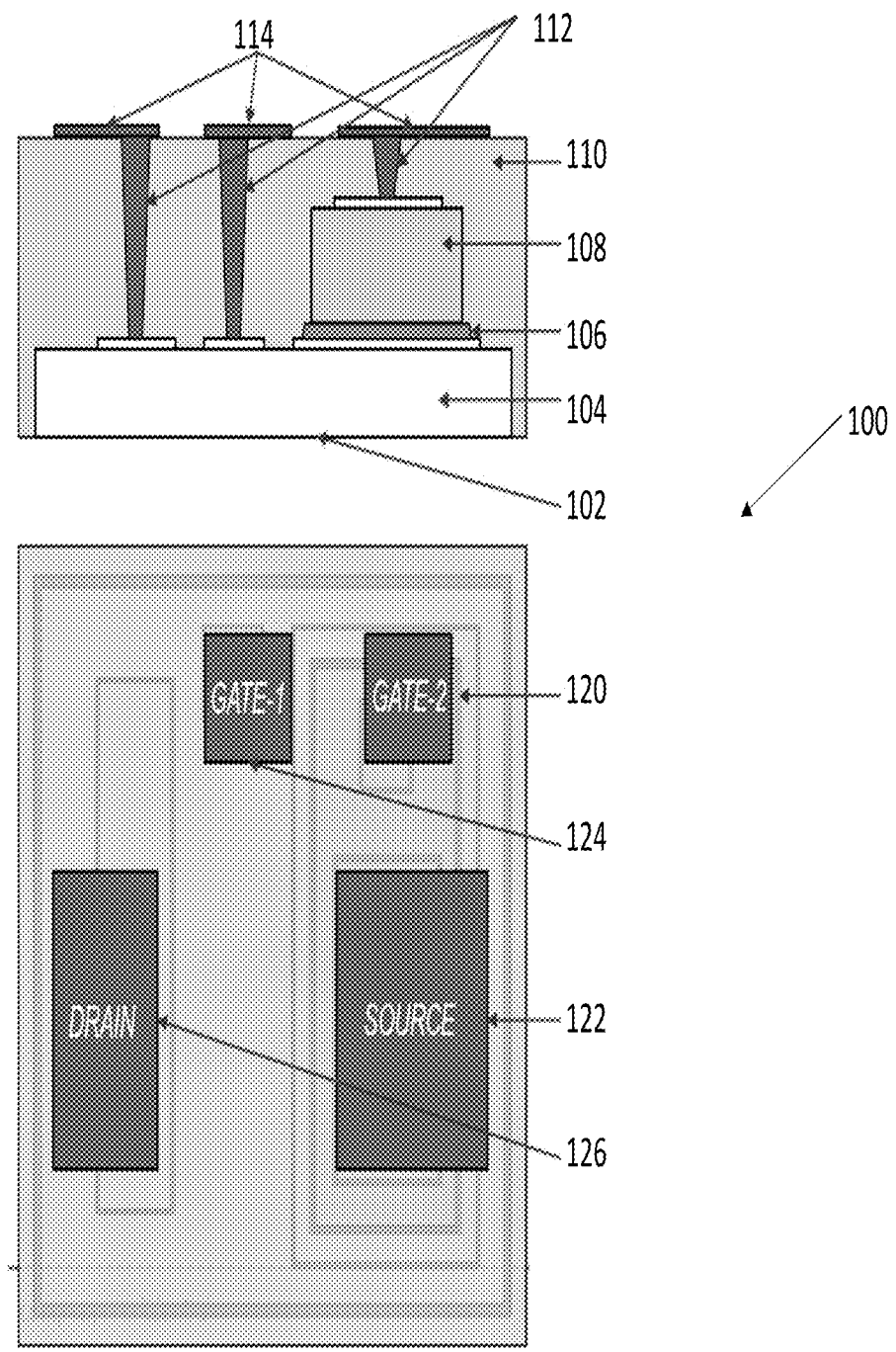
FIG. 3 illustrates a semiconductor device according to an embodiment of the disclosure.

FIG. 3 illustrates an embodiment of the present disclosure. A semiconductor package 100 comprises a GaN HEMT die 104. The GaN HEMT comprises an exposed back side 102. A MOSFET die 108 is positioned on the top side of the GaN HEMT die 104, and it is attached to the GaN HEMT die 104 by a die attach adhesive or solder 106. An encapsulant 110 is deposed on the top of the whole semiconductor package, i.e. on the top of both the GaN HEMT die 104 and the MOSFET die 108. Within the encapsulant 110 there are laser drilled and metalized vias 112. The Cu films of the package contact terminals 114 are placed on the top side of these vias 112. In FIG. 3 a top view of the semiconductor package 100 is also shown. The gate terminal of the MOSFET die 120, the source terminal of the MOSFET die 122, the gate terminal of the GaN HEMT die 124, the drain terminal of the GaN HEMT die 126 are visible in said top view of the semiconductor device.

Although the embodiment shown in FIG. 3 relates to a GaN HEMT die and a MOSFET die, the disclosure also covers all kinds of wide-bandgap semiconductor devices and packages with a cascode operation.

The disclosure relates to a near chip scale packaging approach enabling KGD stack-die assembly in a power module, which is clearly advantageous compared to an individual bare die assembly or conventional discrete packages.

The packaging according to the embodiments of the disclosure is suitable for packaging for WBG devices, for example D-mode GaN HEMT, SiC JFET, etc., which devices require cascoding of additional silicon MOSFET for safe normally-off operations.

The semiconductor devices according to the embodiments of the present disclosures are used in various products, e.g. a power module.

The exemplary embodiment shown in FIG. 3 is just one of the possibilities covered by the present disclosure. The scope of the disclosure includes all similar embodiments and variations.

The exemplary embodiment shown in FIG. 3, using the GaN HEMT die for illustration, has the following key features:

A driver die is attached to a power die in a stack-die configuration.

The stack-die assembly is encapsulated, with an exposed back side of the power die, or exposed 5 sides in another design around.

The contact pads of the driver and power die are connected to the package terminals by laser drilled and metallized vias.

The package terminals are formed by Cu sintering or alternative metal sintering, using printing or dispensing method.

Figure 4:
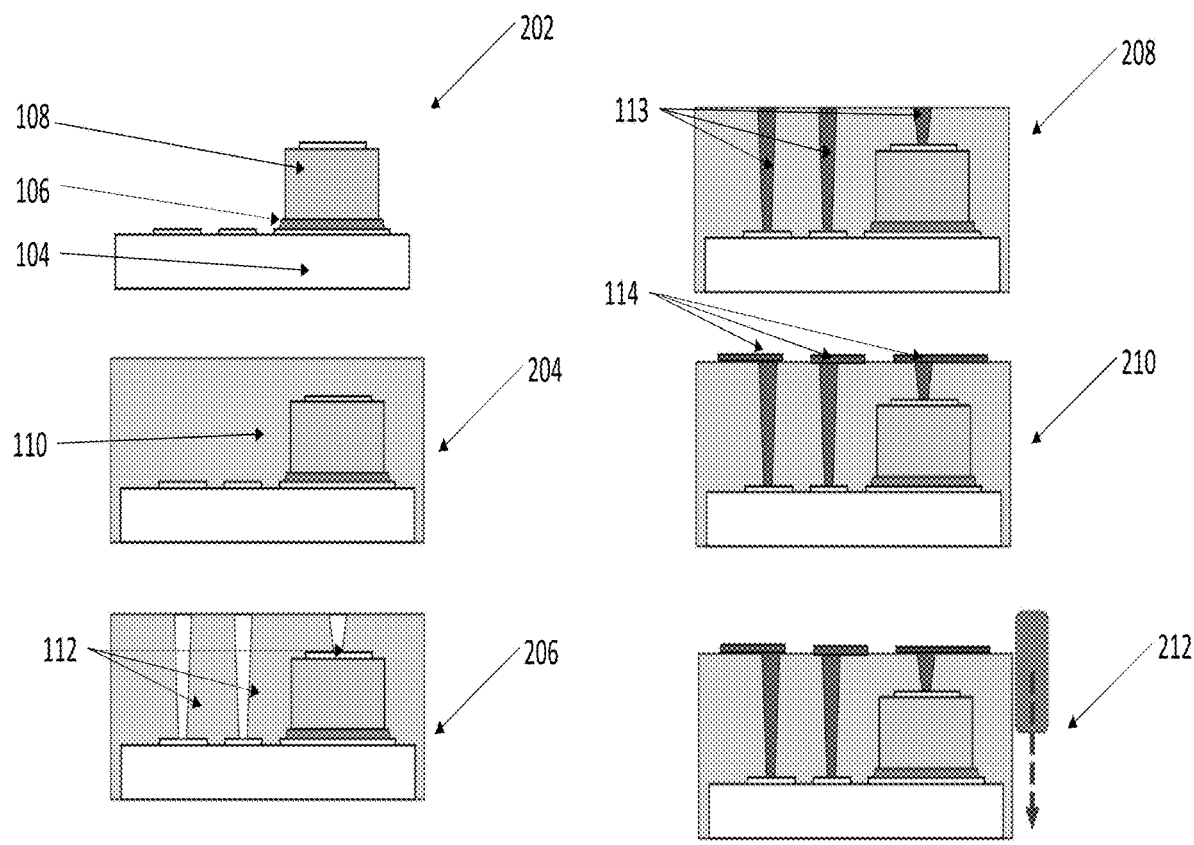
FIG. 4 illustrates a method of manufacturing a semiconductor device according to an embodiment of the disclosure.

An embodiment of the present disclosure is shown in FIG. 4. A method of manufacturing a semiconductor package comprises steps:

Reference sign 202 in FIG. 4:
attach a GaN HEMT die 104 on a film carrier
attach a MOSFET die 108 on the GaN HEMT die 104 using a die attach adhesive 106
cure the die attach material Reference sign 204 in FIG. 4:
encapsulate the stack-die assembly with a mold compound or other encapsulant 110

Figure 5:
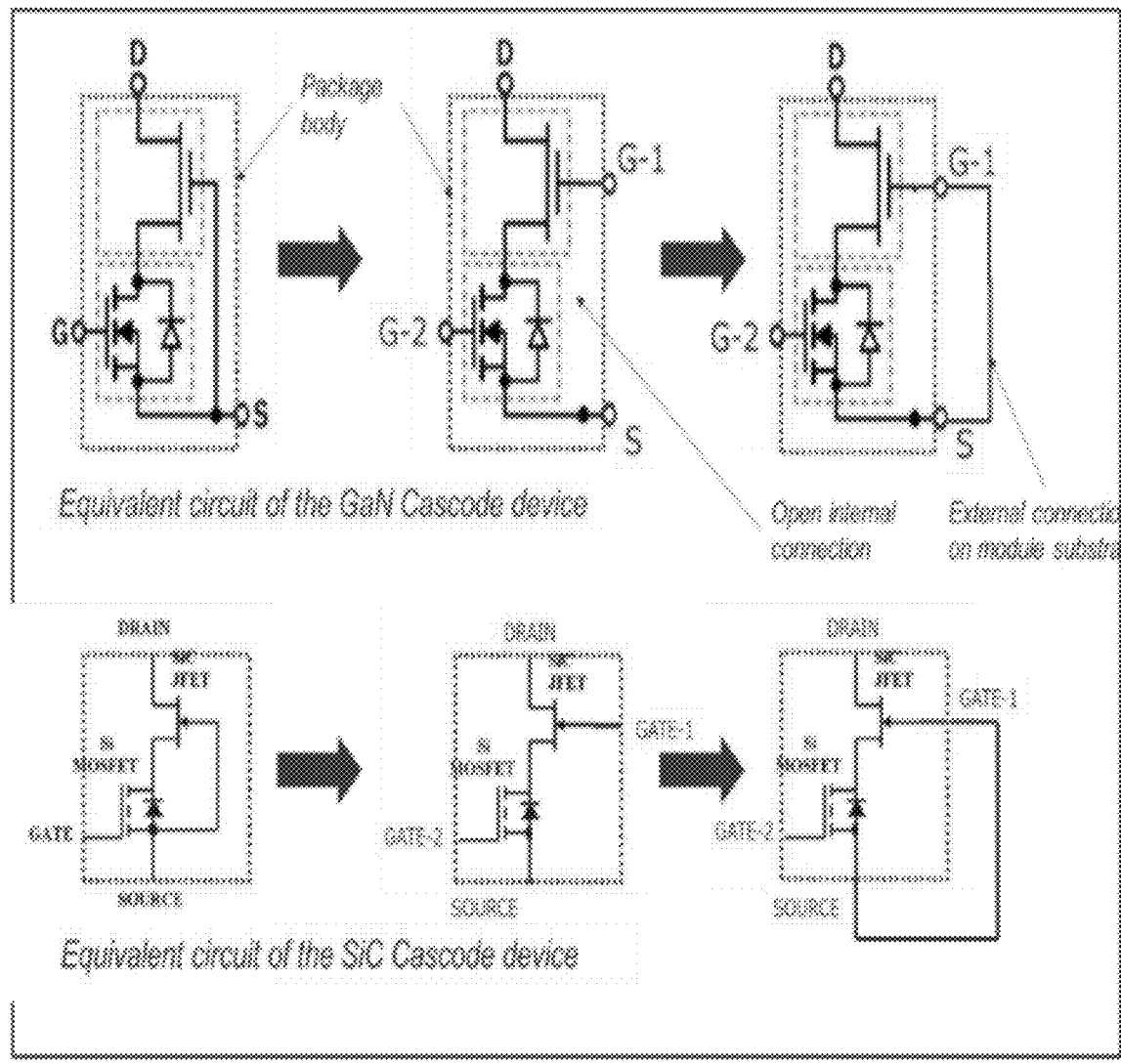
FIG. 5 illustrates a semiconductor device according to an embodiment of the disclosure.

Reference sign 206 in FIG. 4:
laser drill vias 112 to the die pads; multiple vias are possible to improve the performance of the semiconductor package Reference sign 208 in FIG. 4:
metallize 113 the vias, making electrical contacts of the semiconductor package Reference sign 210 in FIG. 4:

sinter a thick Cu film on the encapsulant 110, which creates the package terminal connections 114 to vias organic solderability preservative (OSP) can be applied so to prevent Cu oxidation Reference sign 212 in FIG. 4:
singulate into individual units, e.g. a blade dicing According to an embodiment of the present disclosure, within the cascode circuit, the source of the MOSFET die and the gate of the WBG die are connected together. Such a connection can be done on a module substrate surface. This is illustrated in FIG. 5.

Figure 6A:
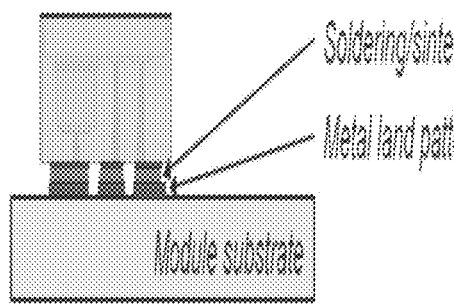
FIGS. 6a and 6b illustrate semiconductor devices according to embodiments of the disclosure.

As shown in FIG. 6a, a stack-die package can be flip chip bonded onto a module substrate using known board mounting methods, e.g. soldering, sintering, etc. Compatible contact metallization will be applied.

Figure 6B:
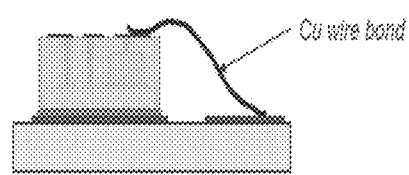

Furthermore, as shown in FIG. 6b, a stack-die package can be bonded onto a module substrate using common die attach method. The pads can be connected to substrate using Cu wire bonding.

According to an embodiment of the disclosure, the gate contact can be relocated to the backside of the wafer, which provides more flexibility in interconnection.

The disclosure is also applicable for vertical devices, e.g. a SiC FET. In this case the package back side is a drain pad.

According to an embodiment of the disclosure, instead of a lead frame carrier, a stack-die assembly can be directly processed on wafer level.

The disclosure also relates to a plurality of stack-die units. A dual stack-die package can be created by final singulation method. The dual stack-die can be further configured for specific application, e.g. a half-bridge, with new terminal pad geometry and connection routing on package top side, formed by new patterns of printed or dispensed Cu sintering materials.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor device comprising:
    a GaN HEMT die, wherein the GaN HEMT die has a gate terminal and a drain terminal;
    a MOSFET die positioned on a top of the GaN HEMT die, wherein the MOSFET die has a gate terminal and a source terminal, and wherein the MOSFET die is attached using a die attach adhesive or solder;
    an encapsulant deposited on a top of the semiconductor device, wherein the encapsulant is covering the GaN HEMT die and the MOSFET die; and
    metalized vias within the encapsulant, wherein the metalized vias are arranged to distribute the gate terminal and the drain terminal of the GaN HEMT die and the gate terminal and the source terminal of the MOSFET die to a top side of the semiconductor device.

2. The semiconductor device as claimed in claim 1, wherein the semiconductor device is a power semiconductor device.

3. A method of producing the semiconductor device of claim 1, the method comprising the steps of:
    attaching a GaN HEMT die on a film carrier;
    attaching a MOSFET die on the GaN HEMT die using a die attach adhesive or solder;
    curing the die attach adhesive or solder;
    encapsulating the GaN HEMT die and the MOSFET die with a mold compound or other encapsulant;
    drilling vias within the encapsulant with a laser to the GaN HEMT die and MOSFET die pads;
    metallizing the vias to make electrical contacts for a gate terminal of and a drain terminal of the GaN HEMT die and electrical contacts for the gate terminal and the source terminal of the MOSFET die;
    sintering a metal film on the encapsulant to create terminals of the semiconductor device; and
    singulating the semiconductor device.

4. The method of manufacturing a semiconductor device as claimed in claim 3, wherein the metal film is a thick Cu film.

5. The method of manufacturing a semiconductor device as claimed in claim 4, wherein the method further comprises a step of depositing an organic solderability preservative on the thick Cu film so to prevent Cu oxidation.

* * * * *